United States Patent
Ootani et al.

(10) Patent No.: US 11,446,752 B2
(45) Date of Patent: Sep. 20, 2022

(54) METHOD FOR PRODUCING JOINED STRUCTURE

(71) Applicant: KOKI Company Limited, Tokyo (JP)

(72) Inventors: Satoshi Ootani, Tokyo (JP); Mitsuyasu Furusawa, Tokyo (JP)

(73) Assignee: KOKI Company Limited, Tokyo (JP)

( * ) Notice: Subject to any disclaimer, the term of this patent is extended or adjusted under 35 U.S.C. 154(b) by 0 days.

(21) Appl. No.: 17/276,990

(22) PCT Filed: Oct. 1, 2019

(86) PCT No.: PCT/JP2019/038727
§ 371 (c)(1),
(2) Date: Mar. 17, 2021

(87) PCT Pub. No.: WO2020/071357
PCT Pub. Date: Apr. 9, 2020

(65) Prior Publication Data
US 2021/0260679 A1     Aug. 26, 2021

(30) Foreign Application Priority Data
Oct. 1, 2018   (JP) .............................. JP2018-186574

(51) Int. Cl.
*B23K 1/00* (2006.01)
*H05K 3/34* (2006.01)
*B23K 1/008* (2006.01)

(52) U.S. Cl.
CPC ............ *B23K 1/008* (2013.01); *H05K 3/34* (2013.01); *H01L 2224/80213* (2013.01); *H01L 2224/81091* (2013.01)

(58) Field of Classification Search
None
See application file for complete search history.

(56) References Cited

U.S. PATENT DOCUMENTS

| | | | | |
|---|---|---|---|---|
| 5,440,101 A | * | 8/1995 | Cox ...................... | B23K 1/008 219/388 |
| 6,334,569 B1 | * | 1/2002 | Yoshimura ............. | B23K 1/008 228/102 |
| 8,061,578 B2 | * | 11/2011 | Hartnett .................. | B23K 1/20 228/56.3 |

(Continued)

FOREIGN PATENT DOCUMENTS

| CN | 1691301 | 11/2005 |
|---|---|---|
| CN | 103229604 | 7/2013 |

(Continued)

*Primary Examiner* — Devang R Patel
(74) *Attorney, Agent, or Firm* — Clark & Brody LP (57) ABSTRACT

A method for producing a joined structure according to the present invention includes: a reflow step of heating a first member and a solder material while keeping them in contact with each other in a reflow chamber to melt a solder alloy constituting the solder material, the reflow step including: a first reflow step of melting the solder alloy with an atmosphere in the reflow chamber reduced to a first pressure $P_1$ lower than the atmospheric pressure; and a second reflow step of, after the first reflow step, melting the solder alloy with the atmosphere in the reflow chamber reduced to a second pressure $P_2$ lower than the first pressure $P_1$.

20 Claims, 1 Drawing Sheet

(56) References Cited

U.S. PATENT DOCUMENTS

| | | | | |
|---|---|---|---|---|
| 8,490,857 B2* | 7/2013 | Matsui | ................ | H01L 24/742 |
| | | | | 228/220 |
| 8,835,772 B2* | 9/2014 | Igarashi | ................ | C09J 171/00 |
| | | | | 228/175 |
| 10,252,364 B2* | 4/2019 | Hiyama | ................ | B23K 1/008 |
| 2005/0156324 A1 | 7/2005 | Nakase et al. | | |
| 2008/0185421 A1* | 8/2008 | Diehm | ................ | B23K 1/008 |
| | | | | 228/176 |
| 2009/0218386 A1 | 9/2009 | Kimbara et al. | | |
| 2010/0320258 A1* | 12/2010 | Sawada | ................ | B23K 1/0016 |
| | | | | 228/180.22 |
| 2013/0200136 A1 | 8/2013 | Besshi et al. | | |
| 2016/0256946 A1 | 9/2016 | Hiyama et al. | | |
| 2019/0009375 A1 | 1/2019 | Hayashi et al. | | |
| 2019/0373741 A1 | 12/2019 | Kakuishi et al. | | |

FOREIGN PATENT DOCUMENTS

| | | | | |
|---|---|---|---|---|
| CN | 107222982 | | 9/2017 | |
| EP | 1968108 | | 9/2008 | |
| JP | 2000-353773 | | 12/2000 | |
| JP | 2001-058259 | | 3/2001 | |
| JP | 2005-205418 | | 8/2005 | |
| JP | 2010-000513 | | 1/2010 | |
| JP | 4404000 | | 1/2010 | |
| JP | 2010000513 A * | | 1/2010 | ............ H01L 24/32 |
| JP | 2012-129482 | | 7/2012 | |
| JP | 2016-155141 | | 9/2016 | |
| WO | 2017/057651 | | 11/2017 | |
| WO | 2018/096917 | | 5/2018 | |

* cited by examiner

METHOD FOR PRODUCING JOINED STRUCTURE

CROSS-REFERENCE TO RELATED APPLICATION

This application claims priority to Japanese Patent Application No. 2018-186574, the disclosure of which is incorporated herein by reference in its entirety.

FIELD

The present invention relates to a method for producing a joined structure.

BACKGROUND

A joined structure in which a part to be joined such as an electronic component is joined to a board can be produced by, for example, applying a solder paste including a solder alloy and a flux to an electrode on a surface of the board, followed by heating (reflow soldering) in a state where an electrode of the electronic component is in contact with the electrode on the surface of the board via the solder paste. In such a joined structure, the board and the electronic component are joined via a joint portion formed of the solder paste.

Such a joined structure conventionally has a problem that gas generated during the reflow soldering remains in the joint portion as voids (cells). It has been particularly known that a joined structure using an Si chip as a part to be joined generates a large number of voids in the joint portion. The voids present in the joint portion decrease the contact area between the part to be joined and the board and thereby increase the electrical resistance therebetween, which impairs the electrical reliability of the joined structure. Further, the voids in the joint portion prevent the heat conduction, which decreases the heat dissipation of the joined structure.

In recent years, there has been known a method in which reflow is performed by reducing the atmosphere in a reflow chamber to a pressure lower than the atmospheric pressure (hereinafter also referred to as vacuum reflow) (for example, Patent Literature 1). In this method, the atmosphere in the reflow chamber is reduced so that voids formed in the joint portion are expanded and thus allowed to be easily expelled to the outside of the joint portion so that the voids in the joint portion can be reduced.

CITATION LIST

Patent Literature

Patent Literature 1: WO 2017/057651 A

SUMMARY

Technical Problem

In the vacuum reflow, voids tend to be more easily expelled to the outside of a joint portion as the reduction of the pressure in the reflow chamber becomes larger, and consequently, the voids in the joint portion can be further reduced. However, the larger the reduction of the pressure in the reflow chamber, the large the number of voids expelled to the outside of the joint portion during the reflow. Because of this, the solder materials (e.g. solder foil, solder paste, etc.) are likely to be scattered. As a result, there has been a problem of occurrence of, for example, short-circuiting between the electrode of the part to be joined, or contamination of the board. Such a problem has been caused not only in the joined structure in which the part to be joined is joined to the board via the solder material, but also in the joined structure formed by applying the solder material to the board (for example, solder bumping).

The present invention has been conceived in view of the above circumstances, and it is an object of the present invention to provide a method for producing a joined structure that reduces voids in a joint portion and suppresses the solder material from scattering.

Solution to Problem

Immediately after the solder is molten, a large amount of gas is generated to increase the pressure inside the voids formed in the joint portion. This causes the voids to be expanded and easily expelled to the outside of the joint portion. On the other hand, when a certain time has elapsed after the solder is molten, the amount of the generated gas is reduced, which causes reduction of the difference between the pressure inside of the voids formed in the joint portion and the pressure in the reflow chamber. This makes it hard for the voids to be expelled to the outside of the joint portion and consequently remain as small voids in the joint portion. In view of such circumstances, the present inventors have found that a joined structure that reduces voids in a joint portion and suppresses the solder material from scattering, can be obtained by a reflow step, in which a solder alloy is molten with an atmosphere in the reflow chamber reduced to a pressure lower than the atmospheric pressure, followed by melting the solder alloy at a further reduced pressure. The summary of the present invention is provided below.

The method for producing a joined structure according to the present invention includes: a reflow step of heating a first member and a solder material while keeping them in contact with each other in a reflow chamber to melt a solder alloy constituting the solder material, the reflow step including: a first reflow step of melting the solder alloy with an atmosphere in the reflow chamber reduced to a first pressure $P_1$ lower than the atmospheric pressure; and a second reflow step of, after the first reflow step, melting the solder alloy with the atmosphere in the reflow chamber reduced to a second pressure $P_2$ lower than the first pressure $P_1$.

In the method for producing a joined structure according to the present invention, the reflow step may include melting the solder alloy constituting the solder material by heating the first member, a second member, and the solder material, while keeping the first member and the second member in contact with each other via the solder material in the reflow chamber.

In the method for producing a joined structure according to the present invention, a ratio ($P_2/P_1$) of the second pressure $P_2$ to the first pressure $P_1$ is preferably 0.0017 to 0.8.

In the method for producing a joined structure according to the present invention, it is preferable that the first reflow step include keeping the atmosphere at a peak temperature for a first retention time $T_1$, the second reflow step includes keeping the atmosphere at the peak temperature for a second retention time $T_2$, and a ratio ($T_2/T_1$) of the second retention time $T_2$ to the first retention time $T_1$ be 0.017 to 59.

In the method for producing a joined structure according to the present invention, it is preferable that the reflow step further include a third reflow step of, after the second reflow step, pressurizing the atmosphere in the reflow chamber to the atmospheric pressure at a temperature equal to or higher than the melting point of the solder alloy.

DESCRIPTION OF EMBODIMENTS

Hereinafter, the method for producing a joined structure according to an embodiment of the present invention will be described.

<Method for Producing a Joined Structure>

The method for producing a joined structure according to this embodiment includes: a reflow step of heating a board (first member), a part to be joined (second member), and a solder material while keeping the board in contact with the part to be joined via the solder material in a reflow chamber to melt a solder alloy constituting the solder material, the reflow step including: a first reflow step of melting the solder alloy with an atmosphere in the reflow chamber reduced to a first pressure $P_1$ lower than the atmospheric pressure; and a second reflow step of, after the first reflow step, melting the solder alloy with the atmosphere in the reflow chamber reduced to a second pressure $P_2$ lower than the first pressure $P_1$.

The solder material used in the method for producing a joined structure according to this embodiment is not particularly limited and can be a solder foil made of a solder alloy, a solder paste made of a solder alloy powder and a flux, or the like. The solder alloy used herein can be a known solder alloy such as Sn—Ag based alloy, Sn—Ag—Cu based alloy (SAC-based alloy), Sn—Ag—Cu—Sb based alloy, Sn—Ag—Cu—Bi based alloy, Sn—Ag—Sb based alloy, Sn—Cu based alloy, Sn—Bi based alloy, Sn—Zn based alloy, Sn—In based alloy, or Pb—Sn based alloy. The flux is not particularly limited and the flux used herein can be a known flux such as a base resin, an active agent, a solvent, or a thixotropic agent.

Such a solder material can be disposed on a surface of the board (first member) using known methods such as printing by the solder printer, transfer printing, applying by the dispenser, and mounting by the mounter. The board (first member) is not particularly limited and can be a known board such as a printed circuit board, a DBC board, a base plate, a lead frame, or a silicon wafer.

The part to be joined (second member) is disposed to be in contact with the board (first member) via the solder material. The part to be joined (second member) is not particularly limited and the part to be joined herein used can be a known part to be joined such as a chip part (e.g. an IC chip), a resistor, a diode, a capacitor, a transistor, a semiconductor chip (e.g. a Si chip), and a heat sink. In particular, the method for producing a joined structure according to this embodiment exhibits an excellent effect even in the case where a Si chip is used as the part to be joined.

The method for producing a joined structure according to this embodiment herein is not limited to the case where the first member is a board. Examples of the first member other than the board include a chip part (e.g. an IC chip), a resistor, a diode, a capacitor, a transistor, a semiconductor chip (e.g. a Si chip), and a heat sink. Further, the method for producing a joined structure according to this embodiment is not limited to the case where the second member is a part to be joined. Examples of the second member other than the part to be joined include a printed circuit board, a DBC board, a base plate, a lead frame, and a heat sink.

In the method for producing a joined structure according to this embodiment, the solder alloy constituting the solder material may be molten by heating the solder material and the first member while keeping the first member in contact with the solder material without using the second member. Examples of the joined structure formed in this manner include a solder bump.

The board (first member) and the part to be joined (second member), which are kept in contact with each other via the solder material, are placed in the reflow chamber. The reflow chamber has an openable and closable shutter and can be tightly sealed by closing the shutter. The reflow chamber is configured to expel a gas from the inside of the reflow chamber using a vacuum pump, thereby reducing the atmosphere in the chamber to about 10 Pa. Further, an inert gas such as nitrogen, a reduction gas such as formic acid or hydrogen, or the like can be introduced into the reflow chamber.

In the reflow chamber in which the board (first member) and the part to be joined (second member), which are in contact with each other via the solder material, are placed, it is preferable that the oxygen concentration in the reflow chamber be decreased in advance by repeating the step of expelling the gas from the inside of the reflow chamber and thereafter introducing an inert gas such as nitrogen into the reflow chamber.

Figure 1:
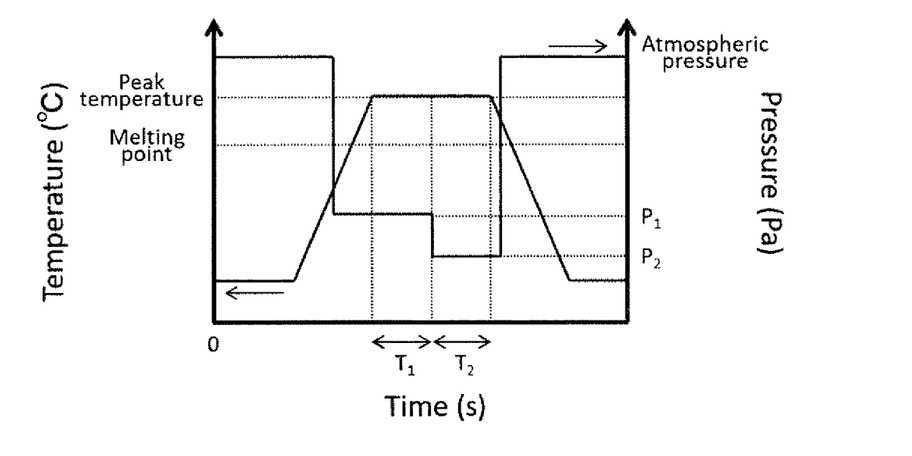
FIG. 1 is a graph showing an example of a reflow temperature profile and a pressure change in a reflow chamber in a method for producing a joined structure according to this embodiment.

Next, the board (first member), the part to be joined (second member), and the solder material, in which the board is kept in contact with the part to be joined via the solder material are heated in the reflow chamber to melt the solder alloy constituting the solder material (reflow step). FIG. 1 is a graph showing an example of a reflow temperature profile and a pressure change in a reflow chamber in the method for producing a joined structure according to this embodiment.

In the reflow step, the reflow chamber first is reduced to a first pressure $P_1$ lower than the atmospheric pressure and thereafter the solder alloy is molten in this state (first reflow step). The first reflow step will be hereinafter described in detail.

The inside of the reflow chamber is first heated, and the atmosphere in the reflow chamber is reduced to a first pressure $P_1$ lower than the atmospheric pressure before the solder alloy is molten, that is, before the reflow temperature reaches the melting point of the solder alloy. The scattering of the solder material can be further suppressed by reducing the atmosphere to the first pressure $P_1$ before the solder alloy is molten. The heating rate is not particularly limited and can be appropriately selected depending on the solder material. For example, it may be set in the range of 0.5 to 5.0° C./s. The first pressure $P_1$ is not particularly limited and can be appropriately selected depending on the solder material. For example, it may be set in the range of 200 Pa to 30,000 Pa.

Subsequently, the inside of the reflow chamber is further heated, and, when the reflow temperature reaches a peak temperature, the peak temperature is kept for a first retention time $T_1$. The peak temperature is not particularly limited and can be appropriately selected depending on the solder material. For example, it may be set in the range of 230 to 400° C. The first retention time $T_1$ is not particularly limited and can be appropriately selected depending on the solder material. For example, it may be set in the range of 10 to 300 s, preferably in the range of 30 to 120 s.

In the method for producing a joined structure according to this embodiment, the reduction to the first pressure $P_1$ is performed before the solder alloy is molten, but is not limited thereto, and the reduction to the first pressure $P_1$ may be started after the solder alloy starts to melt, that is, after the reflow temperature reaches the temperature equal to or higher than the melting point of the solder alloy.

The method for producing a joined structure according to this embodiment includes keeping the reflow temperature at the peak temperature for the first retention time $T_1$, but is not limited thereto, and may be performed without keeping the reflow temperature at the peak temperature.

In the reflow step, the solder alloy is molten with the atmosphere in the reflow chamber reduced to a second pressure $P_2$ lower than the first pressure $P_1$ after the first reflow step (second reflow step). The second reflow step will be hereinafter described in detail.

First, after keeping the reflow temperature for the first retention time $T_1$ in the first reflow step is ended, the atmosphere in the reflow chamber is reduced to a second pressure $P_2$ lower than the first pressure $P_1$, while the reflow temperature is kept at the peak temperature. The second pressure $P_2$ is not particularly limited, and can be appropriately selected depending on the solder material. For example, it may be set in the range of 50 Pa to 5,000 Pa.

After the atmosphere in the reflow chamber is reduced to the second pressure $P_2$, the reflow temperature is kept at the peak temperature for a second retention time $T_2$. The peak temperature herein can be in the same range as the peak temperature in the first reflow step. The second retention time $T_2$ is not particularly limited and can be appropriately selected depending on the solder material. For example, it may be set in the range of 10 to 300 s, preferably in the range of 30 to 120 s.

The method for producing a joined structure according to this embodiment includes keeping the reflow temperature at the peak temperature for the second retention time $T_2$, but is not limited thereto, and may be performed without keeping the reflow temperature at the peak temperature.

A ratio $(P_2/P_1)$ of the second pressure $P_2$ to the first pressure $P_1$ is preferably 0.0017 or more, and preferably 0.8 or less. The ratio $P_2/P_1$ is more preferably 0.05 or more, particularly preferably 0.1 or more, and more preferably 0.5 or less, particularly preferably 0.25 or less.

A ratio $(T_2/T_1)$ of the second retention time $T_2$ to the first retention time $T_1$ is preferably 0.017 or more, and preferably 59 or less. Further, the ratio $T_2/T_1$ is more preferably 0.33 or more, and more preferably 3 or less.

In the reflow step, after the second reflow step, the atmosphere in the reflow chamber is further pressurized to the atmospheric pressure at a temperature equal to or higher than the melting point of the solder alloy (third reflow step). Specifically, the atmosphere in the reflow chamber can be pressurized to the atmospheric pressure by introducing an inert gas such as nitrogen into the reflow chamber.

In the method for producing a joined structure according to this embodiment, the atmosphere in the reflow chamber is pressurized to the atmospheric pressure at a temperature equal to or higher than the melting point of the solder alloy, but is not limited thereto, and the atmosphere in the reflow chamber may be pressurized to the atmospheric pressure at a temperature less than the melting point of the solder alloy.

In the method for producing a joined structure according to this embodiment, a preheating step may be performed before the above-described reflow step. The preheating step is performed by, for example, heating the board and the part to be joined, which are in contact with each other via the solder material, to a preheating temperature and they are kept at the preheating temperature in the reflow chamber. The preheating temperature is not particularly limited and can be appropriately selected depending on the solder material. For example, it may be set in the range of 120 to 310° C. The time for which those members are kept at the preheating temperature is not particularly limited and can be appropriately selected depending on the solder material. For example, it may be set in the range of 0 to 900 s.

The preheating step may be configured such that a gas in the reflow chamber is expelled using a vacuum pump during the inside of the reflow chamber is kept at the preheating temperature, and after keeping such a state, the atmosphere in the reflow chamber is pressurized to the atmospheric pressure. When the atmosphere in the reflow chamber is pressurized to the atmospheric pressure, a reduction gas such as formic acid or hydrogen may be introduced. Voids in the joint portion can be further reduced in the above-described reflow step by introducing a reduction gas into the reflow chamber in the preheating step. The reduction gas may be introduced before the gas in the reflow chamber is expelled, and may be continuously introduced in the preheating step. Also, the reduction gas such as formic acid or hydrogen may be introduced after the gas in the reflow chamber is expelled using a vacuum pump before the preheating step is started.

The method for producing a joined structure according to this embodiment includes: a reflow step of heating a first member and a solder material while keeping them in contact with each other in a reflow chamber to melt a solder alloy constituting the solder material, the reflow step including: a first reflow step of melting the solder alloy with an atmosphere in the reflow chamber reduced to a first pressure $P_1$ lower than the atmospheric pressure; and a second reflow step of, after the first reflow step, melting the solder alloy with the atmosphere in the reflow chamber reduced to a second pressure $P_2$ lower than the first pressure $P_1$. Thereby, small voids remaining in the joint portion in the first reflow step can be expelled to the outside of the joint portion in the second reflow step. As a result, voids in the joint portion can be reduced. Further, the amount of voids expelled to the outside of the joint portion in the second reflow step is smaller than that in the first reflow step, and therefore scattering of the solder material can be suppressed even if the atmosphere is reduced to the second pressure $P_2$ lower than the first pressure $P_1$.

In the method for producing a joined structure according to this embodiment, the reflow step may be configured such that the solder alloy constituting the solder material is molten by heating the first member and the second member which are kept in contact with each other via the solder material in the reflow chamber. Even with this configuration, voids in the joint portion can be reduced and scattering of the solder material can be suppressed.

In the method for producing a joined structure according to this embodiment, the ratio $(P_2/P_1)$ of the second pressure $P_2$ to the first pressure $P_1$ is preferably 0.0017 to 0.8. With this configuration, a joined structure, in which voids in the joint portion are further reduced and scattering of the solder material is further suppressed, can be obtained.

In the method for producing a joined structure according to this embodiment, it is preferable that the first reflow step be configured such that the reflow temperature is kept at the peak temperature for a first retention time $T_1$, the second reflow step is configured such that the reflow temperature is kept at the peak temperature for a second retention time $T_2$, and a ratio $(T_2/T_1)$ of the second retention time $T_2$ to the first retention time $T_1$ is set to be 0.017 to 59. With this configuration, a joined structure, in which voids in the joint portion are further reduced and scattering of the solder material is further suppressed, can be obtained.

In the method for producing a joined structure according to this embodiment, it is preferable that the reflow step further include a third reflow step of, after the second reflow step, pressurizing the atmosphere in the reflow chamber to the atmospheric pressure at a temperature equal to or higher than the melting point of the solder alloy. With this configuration, a joined structure, in which voids in the joint portion are further reduced, can be obtained.

EXAMPLES

Examples of the present invention will be hereinafter described; however, the present invention is not limited to the following examples.

[Test 1]

<Preparation of Test Board>

(Test Nos. 1-1 to 1-14)

Aboard of oxygen-free Cu plate (size: 44×35 mm) and an Au/Ni plated Si chip (size: 10×10 mm), which are kept in contact with each other via a solder foil (size: 10×10 mm, thickness: 100 μm) made of Alloy A (96.5 of Sn/3.0 of Ag/0.5 of Cu), were placed in a reflow chamber of a reflow device (product name: VS1, manufactured by Origin Electric Co., Ltd.). Then, test boards of Test Nos. 1-1 to 1-14 were prepared by performing the preheating step and the reflow step to be described later.

In the preheating step, first, the reflow chamber was heated to a preheating temperature of 200° C. at a heating rate of 1.7° C./s under a nitrogen atmosphere. Then, a gas in the reflow chamber was expelled using a vacuum pump and kept unchanged for 30 s at the preheating temperature, and thereafter the atmosphere in the reflow chamber was pressurized to the atmospheric pressure by introducing formic acid (3%) and kept unchanged for 240 s.

Subsequently, in the reflow step, the atmosphere in the reflow chamber was first reduced to the first pressure $P_1$, thereafter heated to a peak temperature of 250° C. at a heating rate of 2.6° C./s and kept for the first retention time $T_1$ (i.e. first reflow step). Next, the atmosphere in the reflow chamber was reduced to the second pressure $P_2$ and kept for the second retention time $T_2$ (i.e. second reflow step). Lastly, nitrogen was introduced into the reflow chamber at a peak temperature of 250° C. to pressurize the inside of the reflow chamber to the atmospheric pressure. The detailed conditions for the first reflow step and the second reflow step are shown in Table 1.

(Test Nos. 2-1 to 2-6)

Test boards of Test Nos. 2-1 to 2-6 were prepared in the same manner as Test Nos. 1-1 to 1-14 except that the second reflow step was not performed. The detailed conditions for the reflow step are shown in Table 1.

(Test No. 1-15)

A board of Ni plated Cu plate (size: 44×35 mm) and a Ni plate (size: 15 mm×15 mm), which were kept in contact with each other via a solder foil (size: 15 mm×15 mm, thickness: 100 μm) made of Alloy A (96.5 of Sn/3.0 of Ag/0.5 of Cu), were placed in a reflow chamber of a reflow device (product name: VS1, manufactured by Origin Electric Co., Ltd.). A test board was prepared in the same manner as Test Nos. 1-1 to 1-14 except that the atmosphere was reduced to the first pressure $P_1$ after being heated the peak temperature in the atmospheric pressure in the reflow step. The detailed conditions for the reflow step are shown in Table 1.

(Test No. 2-7)

A test board was prepared in the same manner as in Test No. 1-15 except that the second reflow step was not performed. The detailed conditions for the reflow step are shown in Table 1.

<Evaluation of Voids>

An X-ray picture of each of the test boards at a Si chip mounting position was taken by using TUX-3100 (manufactured by Mars Tohken Solution Co., Ltd.) as the image capturing device with the image capturing conditions of tube voltage: 75.0 V, tube current: 80.0 μA, and filament current: 3.130 A. Next, the picture captured was binarized to calculate a void ratio of the joint portion. The test boards of Test Nos. 1-1 to 1-14 were compared with the test board(s) among Test Nos. 2-1 to 2-6, which has/have a value of the first pressure $P_1$ in the first reflow step and a total retention time $(T_1+T_2)$ at the peak temperature in the first reflow step and the second reflow step equal to those of the test boards of Test Nos. 1-1 to 1-14, to calculate a rate of reduction in the void ratio. The results are shown in Table 1.

<Evaluation of Scattering>

Each of the test boards was visually observed from above and evaluated based on the criteria below.

⊚: Almost no scattering was observed.

○: Slight scattering was observed.

x: Large scattering was observed.

TABLE 1

| | | First reflow step | | Second reflow step | | | | | Evaluation of voids | | | |
| | | | | | | | | | | Comparative test No. | Rate of reduction (%) | Evaluation of scattering |
| Class | Test No. | First pressure $P_1$ (Pa) | First retention time $T_1$ (s) | Second pressure $P_2$ (Pa) | Second retention time $T_2$ (s) | Peak temperature (° C.) | $P_2/P_1$ | $T_2/T_1$ | Void ratio (%) | | | |
|---|---|---|---|---|---|---|---|---|---|---|---|---|
| Ex. | 1-1 | 1000 | 10 | 50 | 10 | 250 | 0.05 | 1 | 0.91 | 2-1 | 72 | ⊚ |
| | 1-2 | 1000 | 30 | 50 | 30 | 250 | 0.05 | 1 | 038 | 2-2 | 86 | ⊚ |
| | 1-3 | 1000 | 60 | 50 | 60 | 250 | 0.05 | 1 | 0.10 | 2-3 | 91 | ⊚ |
| | 1-4 | 1000 | 300 | 50 | 300 | 250 | 0.05 | 1 | 1.26 | 2-4 | 46 | ⊚ |
| | 1-5 | 1000 | 30 | 100 | 30 | 250 | 0.1 | 1 | 0.37 | 2-2 | 87 | ⊚ |
| | 1-6 | 1000 | 30 | 500 | 30 | 250 | 0.5 | 1 | 0.13 | 2-2 | 95 | ⊚ |
| | 1-7 | 1000 | 30 | 800 | 30 | 250 | 0.8 | 1 | 0.41 | 2-2 | 85 | ⊚ |
| | 1-8 | 30000 | 30 | 5000 | 30 | 250 | 0.17 | 1 | 0.94 | 2-5 | 73 | ⊚ |
| | 1-9 | 30000 | 30 | 50 | 30 | 250 | 0.0017 | 1 | 0.46 | 2-5 | 87 | ⊚ |
| | 1-10 | 200 | 30 | 50 | 30 | 250 | 0.25 | 1 | 0.31 | 2-6 | 89 | ⊚ |
| | 1-11 | 1000 | 10 | 50 | 590 | 250 | 0.05 | 59 | 1.30 | 2-4 | 44 | ⊚ |
| | 1-12 | 1000 | 590 | 50 | 10 | 250 | 0.05 | 0.017 | 0.71 | 2-4 | 70 | ⊚ |
| | 1-13 | 1000 | 30 | 50 | 90 | 250 | 0.05 | 3 | 0.27 | 2-3 | 76 | ⊚ |
| | 1-14 | 1000 | 90 | 50 | 30 | 250 | 0.05 | 0.33 | 0.04 | 2-3 | 96 | ⊚ |
| | 1-15 | 5000 | 60 | 500 | 60 | 250 | 0.1 | 1 | 1.47 | 2-7 | 41 | ⊚ |
| C. Ex. | 2-1 | 1000 | 20 | — | — | 250 | — | — | 3.23 | — | — | ○ |
| | 2-2 | 1000 | 60 | — | — | 250 | — | — | 2.79 | — | — | ○ |

TABLE 1-continued

| | | Reflow step | | | | | | Evaluation result | | | |
| | | First reflow step | | Second reflow step | | | | | Evaluation of voids | | |
| Class | Test No. | First pressure $P_1$ (Pa) | First retention time $T_1$ (s) | Second pressure $P_2$ (Pa) | Second retention time $T_2$ (s) | Peak temperature (° C.) | $P_2/P_1$ | $T_2/T_1$ | Void ratio (%) | Comparative test No. | Rate of reduction (%) | Evaluation of scattering |
|---|---|---|---|---|---|---|---|---|---|---|---|---|
| | 2-3 | 1000 | 120 | — | — | 250 | — | — | 1.13 | — | — | ○ |
| | 2-4 | 1000 | 600 | — | — | 250 | — | — | 2.34 | — | — | X |
| | 2-5 | 30000 | 60 | — | — | 250 | — | — | 3.48 | — | — | ○ |
| | 2-6 | 200 | 60 | — | — | 250 | — | — | 2.77 | — | — | ○ |
| | 2-7 | 5000 | 60 | — | — | 250 | — | — | 2.49 | — | — | ○ |

As seen from the results of Table 1, the test boards of Test Nos. 1-1 to 1-15 satisfying all the requirements of the present invention can reduce voids in the joint portion and suppress scattering of the solder material as compared with the test boards of Test Nos. 2-1 to 2-7 without being subjected to the second reflow step.

[Test 2]

<Preparation of Test Boards>

(Test No. 3-1)

First, Alloy A (96.5 of Sn/3.0 of Ag/0.5 of Cu) powder and a flux (2-ethyl-1,3-hexanediol: 90 mass %, stearic acid amide: 10 mass %) were mixed to prepare a solder paste. Next, the solder paste was applied to a board formed of an oxygen-free Cu plate (size: 44×35 mm) by using a metal mask having a thickness of 200 μm to have an aperture ratio of 100%. The thickness of the applied solder paste was 200 μm. Thereafter, the board of the oxygen-free Cu plate (size: 44×35 mm) that was mounted with an Au/Ni plated Si chip (size: 10×10 mm) and the Au/Ni plated Si chip (size: 10×10 mm), which were kept in contact with each other via the solder paste, were placed in a reflow chamber of a reflow device (product name: VS1, manufactured by Origin Electric Co., Ltd.). Then, a test board of Test No. 3-1 was prepared by performing the preheating step and the reflow step to be described later.

In the preheating step, first, the reflow chamber was heated to a preheating temperature of 200° C. at a heating rate of 1.7° C./s under a formic acid (3%) atmosphere and kept unchanged for 240 s.

Subsequently, in the reflow step, the atmosphere in the reflow chamber was first reduced to the first pressure $P_1$, thereafter heated to a peak temperature of 250° C. at a heating rate of 2.6° C./s and kept unchanged for the first retention time $T_1$ (i.e. first reflow step). Next, the atmosphere in the reflow chamber was reduced to the second pressure $P_2$ and kept unchanged for the second retention time $T_2$ (i.e. second reflow step). Lastly, nitrogen was introduced into the reflow chamber at a peak temperature of 250° C. to pressurize to the atmospheric pressure. The detailed conditions for the reflow step are shown in Table 2.

(Test No. 3-2)

A test board was prepared in the same manner as in Test No. 3-1 except that the preheating step was performed under a nitrogen atmosphere.

(Test No. 3-3)

A test board was prepared in the same manner as in Test No. 3-1 except that the preheating step was not performed, the atmosphere in the reflow chamber was reduced to the first pressure $P_1$, and thereafter heated to the peak temperature under a formic acid atmosphere.

(Test No. 3-4)

A test board was prepared in the same manner as in Test No. 3-1 except that Alloy B (89.0 of Sn/3.0 of Ag/8.0 of Sb) was used as the solder powder and the peak temperature in the reflow step was changed.

(Test No. 3-5)

A test board was prepared in the same manner as in Test No. 3-1 except that Alloy C (95.0 of Pb/5.0 of Sn) was used as the solder powder, the preheat keeping temperature was 230° C., and the first pressure $P_1$ and the peak temperature in the reflow step were changed. The detailed conditions for the reflow step are shown in Table 2.

(Test Nos. 4-1 to 4-5)

Test boards of Test Nos. 4-1 to 4-5 were prepared in the same manner as in Test Nos. 3-1 to 3-5 respectively, except that the second reflow step was not performed. The detailed conditions for the reflow step are shown in Table 2.

<Evaluation of Voids>

The voids were evaluated in the same manner as in Test 1. Table 2 shows the results.

<Evaluation of Scattering>

The scattering was evaluated in the same manner as in Test 1. Table 2 shows the results.

TABLE 2

| | | | | Preheating step | Reflow step | | | | | | | Evaluation result | | | |
| | | | | | First reflow step | | Second reflow step | | | | | Evaluation of voids | | | |
| Class | Test No. | Solder powder | Furnace atmosphere | Preheat retention temperature (° C.) | First pressure $P_1$ (Pa) | First retention time $T_1$ (s) | Second pressure $P_2$ (Pa) | Second retention time $T_2$ (s) | Peak temperature (° C.) | $P_2/P_1$ | $T_2/T_1$ | Void ratio (%) | Comparative test No. | Rate of reduction (%) | Evaluation of scattering |
|---|---|---|---|---|---|---|---|---|---|---|---|---|---|---|---|
| Ex. | 3-1 | Alloy A | Formic acid | 200 | 1000 | 60 | 50 | 60 | 250 | 0.05 | 1 | 0.25 | 4-1 | 89 | ○ |
| | 3-2 | Alloy A | Nitrogen | 200 | 1000 | 60 | 50 | 60 | 250 | 0.05 | 1 | 4.01 | 4-2 | 48 | ○ |

TABLE 2-continued

| Class | Test No. | Solder powder | Furnace atmosphere | Pre-heating step Preheat retention temperature (° C.) | Reflow step First reflow step First pressure $P_1$ (Pa) | First retention time $T_1$ (s) | Second reflow step Second pressure $P_2$ (Pa) | Second retention time $T_2$ (s) | Peak temperature (° C.) | $P_2/P_1$ | $T_2/T_1$ | Evaluation result Evaluation of voids Void ratio (%) | Comparative test No. | Rate of reduction (%) | Evaluation of scattering |
|---|---|---|---|---|---|---|---|---|---|---|---|---|---|---|---|
| | 3-3 | Alloy A | Formic acid | — | 1000 | 60 | 50 | 60 | 250 | 0.05 | 1 | 2.00 | 4-3 | 44 | ○ |
| | 3-4 | Alloy B | Formic acid | 200 | 1000 | 60 | 50 | 60 | 280 | 0.05 | 1 | 0.52 | 4-4 | 70 | ○ |
| | 3-5 | Alloy C | Formic acid | 230 | 5000 | 60 | 50 | 60 | 370 | 0.01 | 1 | 0.92 | 4-5 | 64 | ○ |
| C. Ex. | 4-1 | Alloy A | Formic acid | 200 | 1000 | 120 | — | — | 250 | — | — | 2.28 | — | — | X |
| | 4-2 | Alloy A | Nitrogen | 200 | 1000 | 120 | — | — | 250 | — | — | 7.78 | — | — | X |
| | 4-3 | Alloy A | — | — | 1000 | 120 | — | — | 250 | — | — | 3.60 | — | — | X |
| | 4-4 | Alloy B | Formic acid | 200 | 1000 | 120 | — | — | 280 | — | — | 1.73 | — | — | X |
| | 4-5 | Alloy C | Formic acid | 230 | 5000 | 120 | — | — | 370 | — | — | 2.54 | — | — | X |

As seen from the results of Table 2, the test boards of Test Nos. 3-1 to 3-5 satisfying all the requirements of the present invention can reduce voids in the joint portion and suppress scattering of the solder material as compared with the test boards of Test Nos. 4-1 to 4-5 without being subjected to the second reflow step.

[Test 3]
<Preparation of Test Boards>
(Test No. 5)

First, Alloy A (96.5 of Sn/3.0 of Ag/0.5 of Cu) powder and a flux were mixed to prepare a solder paste. A paste flux (manufactured by Koki Co., Ltd., product name: paste flux (RMA type)) was used as the flux. Next, a glass epoxy board (size: 50×50 mm; thickness: 1.6 mm) was prepared. A pattern of φ0.2 mm was formed on the board with a copper foil and treated with a pre-flux (product name "GLICOAT-SMD" manufactured by Shikoku Chemical Co., Ltd.). The solder paste was applied to the board using a metal mask having a thickness of 150 μm to have an aperture ratio of 400%, and the board was placed in a reflow chamber of a reflow device (product name: VS1, manufactured by Origin Electric Co., Ltd.). The thickness of the applied solder paste was 150 μm. Then, a test board of Test No. 5 was produced by performing the preheating step and the reflow step to be described later.

In the preheating step, first, the reflow chamber was heated to a preheating temperature of 200° C. at a heating rate of 1.7° C./s under a nitrogen atmosphere. Then, a gas in the reflow chamber was expelled using a vacuum pump and kept unchanged for 30 s at the preheating temperature, and thereafter the atmosphere in the reflow chamber was pressurized to the atmospheric pressure by introducing formic acid (3%) and kept unchanged for 240 s.

Subsequently, in the reflow step, the atmosphere in the reflow chamber was first reduced to 5,000 Pa (first pressure $P_1$), thereafter heated to a peak temperature of 250° C. at a heating rate of 2.6° C./s and kept unchanged for the 60 s (first retention time $T_1$) (i.e. first reflow step). Next, the atmosphere in the reflow chamber was reduced to 100 Pa (second pressure $P_2$) and kept unchanged for 60 s (second retention time $T_2$) (i.e. second reflow step). Lastly, nitrogen was introduced into the reflow chamber at a peak temperature of 250° C. to pressurize to the atmospheric pressure. The detailed conditions for the first reflow step and the second reflow step are shown in Table 3.

(Test No. 6)

A test board of Test No. 6 was prepared in the same manner as in Test No. 5 except that the second reflow step was not performed. The detailed conditions for the reflow step are shown in Table 3.

<Evaluation of Voids>

Voids were evaluated in the same manner as in Test 1. The results are shown in Table 3.

<Evaluation of Scattering>

The scattering was evaluated in the same manner as in Test 1. The results are shown in Table 3.

TABLE 3

| Class | Test No. | Solder powder | Furnace atmosphere | Pre-heating step Preheat retention temperature (° C.) | Reflow step First reflow step First pressure $P_1$ (Pa) | First retention time $T_1$ (s) | Second reflow step Second pressure $P_2$ (Pa) | Second retention time $T_2$ (s) | Peak temperature (° C.) | $P_2/P_1$ | $T_2/T_1$ | Evaluation result Evaluation of voids Void ratio (%) | Comparative test No. | Rate of reduction (%) | Evaluation of scattering |
|---|---|---|---|---|---|---|---|---|---|---|---|---|---|---|---|
| Ex. | 5 | Alloy A | Formic acid | 200 | 5000 | 60 | 100 | 60 | 250 | 0.02 | 1 | 3.91 | 6 | 43 | ○ |
| C. Ex. | 6 | Alloy A | Formic acid | 200 | 5000 | 120 | — | — | 250 | — | — | 6.92 | — | — | X |

As seen from the results of Table 3, the test board of Test No. 5 satisfying all the requirements of the present invention can reduce voids in the joint portion and suppress scattering of the solder material as compared with the test board of Test No. 6 without being subjected to the second reflow step.

The invention claimed is:

1. A method for producing a joined structure, the method comprising:
a reflow step of heating a first member and a solder material while keeping them in contact with each other in a reflow chamber to melt a solder alloy constituting the solder material,
the reflow step comprising:
a first reflow step consists of reducing an atmosphere in the reflow chamber from the atmospheric pressure to a first pressure $P_1$ in a single step and keeping the first pressure $P_1$ before the solder alloy is molten, and then melting the solder alloy; and
a second reflow step of, after the first reflow step, melting the solder alloy with the atmosphere in the reflow chamber reduced to a second pressure $P_2$ lower than the first pressure $P_1$.

2. The method for producing a joined structure according to claim 1, wherein
the reflow step comprises melting the solder alloy constituting the solder material by heating the first member, a second member, and the solder material, while keeping the first member and the second member in contact with each other via the solder material in the reflow chamber.

3. The method for producing a joined structure according to claim 1, wherein
a ratio ($P_2/P_1$) of the second pressure $P_2$ to the first pressure $P_1$ is 0.0017 to 0.8.

4. The method for producing a joined structure according to claim 1, wherein
the first reflow step comprises keeping the atmosphere at a peak temperature for a first retention time $T_1$,
the second reflow step comprises keeping the atmosphere at the peak temperature for a second retention time $T_2$, and
a ratio ($T_2/T_1$) of the second retention time $T_2$ to the first retention time $T_1$ is 0.017 to 59.

5. The method for producing a joined structure according to claim 1, wherein
the reflow step further comprises a third reflow step of, after the second reflow step, pressurizing the atmosphere in the reflow chamber to the atmospheric pressure at a temperature equal to or higher than the melting point of the solder alloy.

6. The method for producing a joined structure according to claim 1, wherein
the first pressure $P_1$ is in a range of 200 Pa to 30,000 Pa, and
the second pressure $P_2$ is in a range of 50 Pa to 5,000 Pa.

7. The method for producing a joined structure according to claim 2, wherein
a ratio ($P_2/P_1$) of the second pressure $P_2$ to the first pressure $P_1$ is in a range of 0.0017 to 0.8.

8. The method for producing a joined structure according to claim 2, wherein
the first reflow step comprises keeping the atmosphere at a peak temperature for a first retention time $T_1$,
the second reflow step comprises keeping the atmosphere at the peak temperature for a second retention time $T_2$, and
a ratio ($T_2/T_1$) of the second retention time $T_2$ to the first retention time $T_1$ is 0.017 to 59.

9. The method for producing a joined structure according to claim 3, wherein
the first reflow step comprises keeping the atmosphere at a peak temperature for a first retention time $T_1$,
the second reflow step comprises keeping the atmosphere at the peak temperature for a second retention time $T_2$, and
a ratio ($T_2/T_1$) of the second retention time $T_2$ to the first retention time $T_1$ is 0.017 to 59.

10. The method for producing a joined structure according to claim 7, wherein
the first reflow step comprises keeping the atmosphere at a peak temperature for a first retention time $T_1$,
the second reflow step comprises keeping the atmosphere at the peak temperature for a second retention time $T_2$, and
a ratio ($T_2/T_1$) of the second retention time $T_2$ to the first retention time $T_1$ is 0.017 to 59.

11. The method for producing a joined structure according to claim 2, wherein
the reflow step further comprises a third reflow step of, after the second reflow step, pressurizing the atmosphere in the reflow chamber to the atmospheric pressure at a temperature equal to or higher than the melting point of the solder alloy.

12. The method for producing a joined structure according to claim 7, wherein
the reflow step further comprises a third reflow step of, after the second reflow step, pressurizing the atmosphere in the reflow chamber to the atmospheric pressure at a temperature equal to or higher than the melting point of the solder alloy.

13. The method for producing a joined structure according to claim 8, wherein
the reflow step further comprises a third reflow step of, after the second reflow step, pressurizing the atmosphere in the reflow chamber to the atmospheric pressure at a temperature equal to or higher than the melting point of the solder alloy.

14. The method for producing a joined structure according to claim 10, wherein
the reflow step further comprises a third reflow step of, after the second reflow step, pressurizing the atmosphere in the reflow chamber to the atmospheric pressure at a temperature equal to or higher than the melting point of the solder alloy.

15. The method for producing a joined structure according to claim 2, wherein
the first pressure $P_1$ is in a range of 200 Pa to 30,000 Pa, and
the second pressure $P_2$ is in a range of 50 Pa to 5,000 Pa.

16. The method for producing a joined structure according to claim 3, wherein
the first pressure $P_1$ is in a range of 200 Pa to 30,000 Pa, and
the second pressure $P_2$ is in a range of 50 Pa to 5,000 Pa.

17. The method for producing a joined structure according to claim 4, wherein
the first pressure $P_1$ is in a range of 200 Pa to 30,000 Pa, and
the second pressure $P_2$ is in a range of 50 Pa to 5,000 Pa.

18. The method for producing a joined structure according to claim 7, wherein
the first pressure $P_1$ is in a range of 200 Pa to 30,000 Pa, and
the second pressure $P_2$ is in a range of 50 Pa to 5,000 Pa.

19. The method for producing a joined structure according to claim 8, wherein the first pressure $P_1$ is in a range of 200 Pa to 30,000 Pa, and the second pressure $P_2$ is in a range of 50 Pa to 5,000 Pa.

20. The method for producing a joined structure according to claim 10, wherein the first pressure $P_1$ is in a range of 200 Pa to 30,000 Pa, and the second pressure $P_2$ is in a range of 50 Pa to 5,000 Pa.

\* \* \* \* \*